United States Patent [19]

Ko

[11] Patent Number: 5,565,369
[45] Date of Patent: Oct. 15, 1996

[54] METHOD OF MAKING RETARDED DDD (DOUBLE DIFFUSED DRAIN) DEVICE STRUCTURE

[75] Inventor: Joe Ko, Hsinchu, Taiwan

[73] Assignee: United Microelectronics Corporation, Hsin-Chu, Taiwan

[21] Appl. No.: 517,723

[22] Filed: Aug. 7, 1995

Related U.S. Application Data

[63] Continuation of Ser. No. 115,759, Sep. 3, 1993, abandoned.

[51] Int. Cl.$^6$ .................................................. H01L 21/8234
[52] U.S. Cl. ........................ 437/30; 437/44; 437/149; 437/151; 437/152
[58] Field of Search .............................. 437/30, 44, 149, 437/150, 151, 152

[56] References Cited

U.S. PATENT DOCUMENTS

| | | |
|---|---|---|
| 4,305,201 | 12/1981 | Tielert . |
| 4,342,149 | 8/1982 | Jacobs et al. . |
| 4,577,391 | 3/1986 | Hsia et al. . |
| 4,851,360 | 7/1989 | Haken et al. ............ 437/29 |
| 5,210,044 | 5/1993 | Yoshikawa ............... 437/43 |
| 5,225,357 | 7/1993 | Ho ........................... 437/30 |

OTHER PUBLICATIONS

"VLSI Technology", by S. M. Sze, published by McGraw-Hill International–Singapore, 1988, pp. 482–483.

*Primary Examiner*—Mary Wilczewski
*Assistant Examiner*—Richard A. Booth
*Attorney, Agent, or Firm*—William H. Wright

[57] ABSTRACT

A method of forming a retarded double diffused drain structure, and the resultant retarded double diffused drain structure, for a field effect transistor are described. A silicon substrate with field isolation regions and a gate structure is provided. A layer of photoresist is formed on the field isolation region, the silicon substrate, and the gate structure. The photoresist is patterned to expose the silicon substrate and the gate structure, but covers an area of the silicon substrate that is offset from the field isolation regions. A first ion implant is performed in a vertical direction in exposed regions of the silicon substrate, with suitable dopant having a high doping concentration. The photoresist is removed. A second ion implant is performed in a vertical direction in the silicon substrate, with suitable dopant with higher doping concentration than the first ion implant, in regions between the field isolation regions and the gate structure. The substrate is heated to drive in both the dopants.

19 Claims, 5 Drawing Sheets

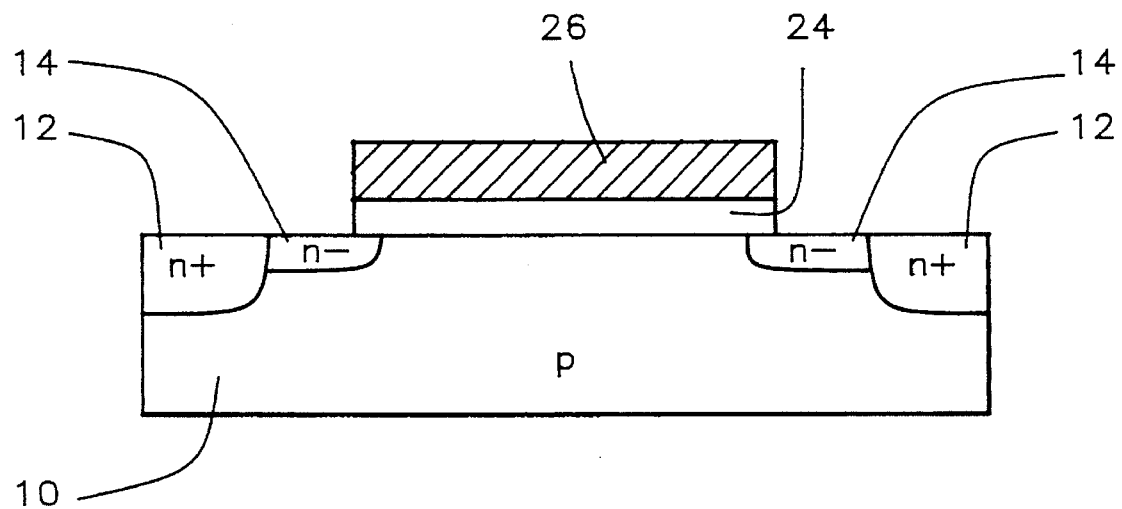
FIG. 1 – Prior Art
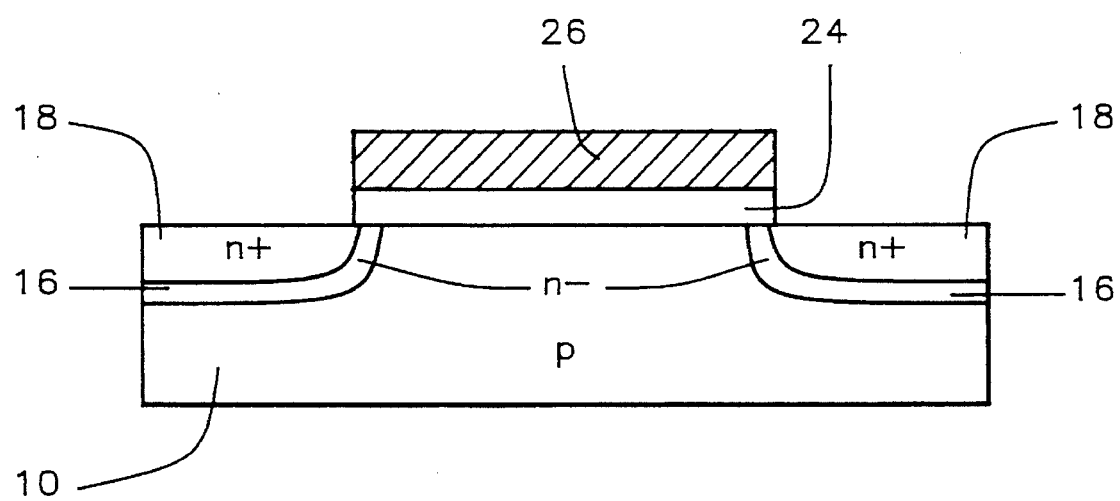
FIG. 2 – Prior Art

METHOD OF MAKING RETARDED DDD (DOUBLE DIFFUSED DRAIN) DEVICE STRUCTURE

This application is a continuation of Ser. No. 08/115,757, filed Sep. 3, 1993, now abandoned.

BACKGROUND OF THE INVENTION (1) Field of the Invention

The invention relates to the manufacture of highly dense integrated circuits and more particularly to the formation of a retarded double diffused drain structure in a field effect transistor.

(2) Description of the Related Art

In the manufacture of highly dense integrated circuits using Metal:Oxide Semiconductor Field Effect Transistors (MOSFET) technology, as device dimensions decrease, there has been a need to create shallower source/drain regions. However, corresponding high doping concentrations lead to an increase in the electric field in the device channel in the region adjacent to the drain. This high electric field causes electrons in the device channel to gain energy and be injected into the gate oxide. This phenomenon is known as the "hot electron" problem. This in turn leads to long-term device degradation and reduced reliability.

A method to reduce the high electric field at the drain region is to provide a more gradual, or graded, change in the doping concentration at the drain/channel interface. One means of accomplishing this is with a lightly doped drain (LDD) as described in "VLSI TECHNOLOGY" by S. M. Sze, published by McGraw-Hill International—Singapore, 1988, pages 482–483. As shown in FIG. 1, a substrate 10 is implanted with a heavy implant to create regions 12, and an implant with lighter doping concentration to form regions 14. A smaller electric field results at the drain/channel interface than would exist in a device in which a single heavy implant was performed, due to a reduction in the difference in dopant concentrations between the channel and the drain region adjacent to it.

A second approach to minimize the hot electron problem is shown in U.S. Pat. No. 4,851,360 by Haken et al. In this "double diffused drain" method, two implants are performed using the same mask, and results in the FIG. 2 structure. A first implant of phosphorus is followed by a second implant of arsenic. The greater diffusivity of phosphorus causes it to diffuse laterally during the implant anneal, to form region 16, which has a lighter resultant dopant concentration than adjacent region 18 formed by the arsenic implant.

A drawback to the double diffused drain approach is an increase in source/drain junction capacitance. This leads to an increase in the RC constant and an undesirably higher propagation delay, which results in slower performance of the circuits formed with these devices.

SUMMARY OF THE INVENTION

It is therefore a principal object of this invention to provide a method for reducing the source/drain junction capacitance of a MOSFET device while at the same time minimizing the hot electron problem, by forming a retarded double diffused drain.

It is a further object of the invention to provide a retarded double diffused drain, in order to reduce the source/drain capacitance of a MOSFET device while minimizing the hot electron problem.

This object is achieved by a method of forming a retarded double diffused drain structure for a field effect transistor. A silicon substrate with field isolation regions and a gate structure is provided. A layer of photoresist is formed on the field isolation region, the silicon substrate, and the gate structure. The photoresist is patterned to expose the silicon substrate and the gate structure, but covers an area of the silicon substrate that is offset from the field isolation regions. A first ion implant is performed in a vertical direction is exposed regions of the silicon substrate, with suitable dopant having a high doping concentration. The photoresist is removed. A second ion implant is performed in a vertical direction in the silicon substrate, with suitable dopant with higher doping concentrations than the first ion implant, in regions between the field isolation regions and the gate structure. The substrate is heated to drive in both the dopants.

This object is further achieved by a field effect transistor with retarded double diffused drain structure having source and drain regions. A silicon substrate, having field isolation regions that isolate semiconductor surface regions from one another, and a gate element, is provided. There are heavily doped regions in the source and drain regions between the field isolation regions and the gate element. Less heavily doped regions that are adjacent to, but only partially surround, the heavily doped region in the source and drain regions, are on the side of the heavily doped regions that are adjacent to, the gate element.

BRIEF DESCRIPTION OF THE DRAWINGS

FIGS. 1 and 2 are a schematic cross-representation of two prior art methods for reducing the hot electron problem.

DESCRIPTION OF THE PREFERRED EMBODIMENTS

Figure 3:
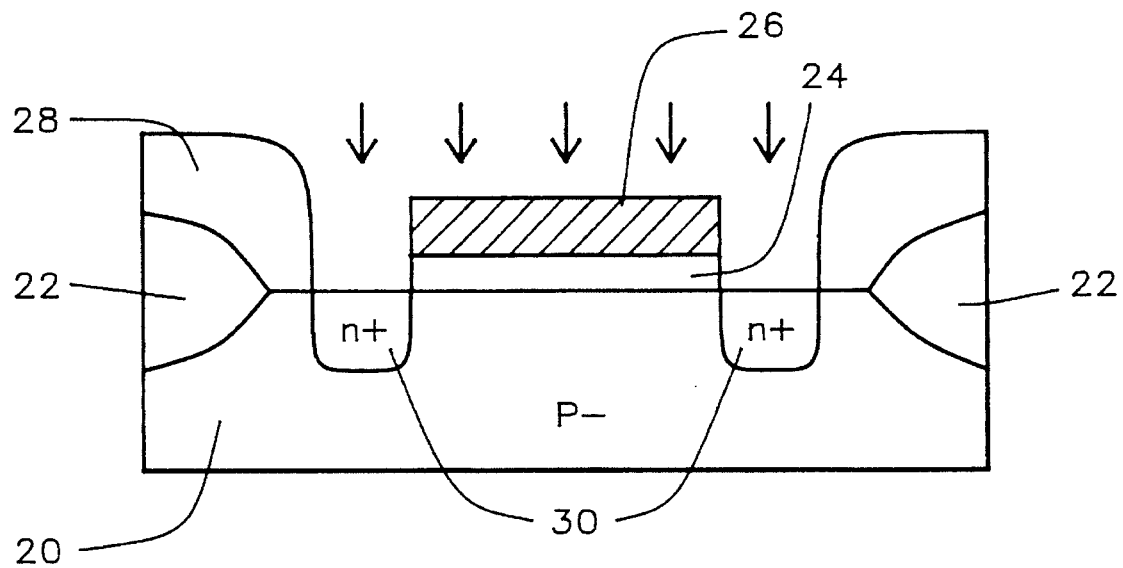
FIGS. 3 through 6 are cross-sectional representations of the improved method and resultant structure of the invention for forming a retarded double diffused-drain for an n-type device.

Referring now to FIG. 3, there is shown a silicon substrate 20 in which field isolation regions 22 have been formed previously, and which serve to separate active regions of the device from one another. The substrate has been doped p-, and may be a p-well as used in CMOS devices for the N-channel structure. Also shown are gate oxide 24 and gate electrode 26. The gate oxide is typically a thin oxide layer formed by thermal oxidation, and the gate itself is typically polysilicon or polysilicon with silicide. These are conventional and their formation is well understood by those familiar with the art, and details will not be given here, as they are not critical to the invention.

A photoresist layer 28 is deposited and patterned by conventional lithography. It is patterned to expose only a part of the source/drain regions, with a portion of such regions adjacent to field isolation regions 22 masked off to prevent implantation.

The critical ion implantation steps of the invention are now performed. There is a first ion implant of phosphorus P31, to inject conductivity-imparting dopant into regions 30 of the source/drain structures. The phosphorus is implanted at a dosage of between about 1 E 14 and 1 E 15 atoms/cm.$^2$ and at an energy of between about 50 and 180 KeV.

Figure 4:
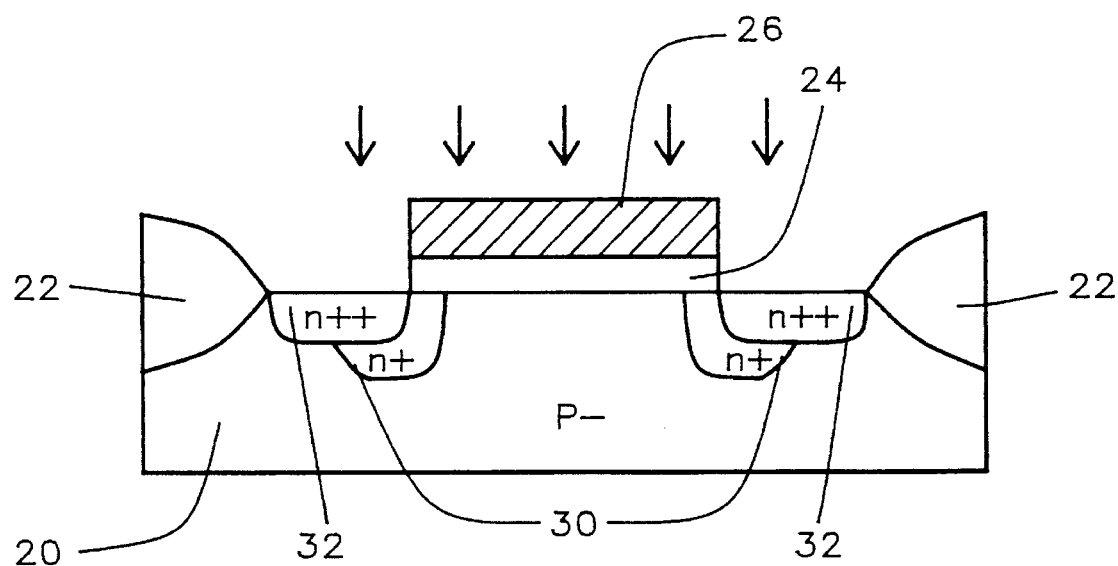

Referring now to FIG. 4, the photoresist is removed, and a second ion implant is performed. The entire source/drain region is implanted, which results in heavily implanted region 32. The implant is at a higher dosage than the first implant, and is accomplished with Arsenic As75 at a dosage of between about 1 E 15 and 5 E 15 atoms/cm.$^2$, and at an energy of between about 50 and 150 KeV. A drive-in step is performed to drive in both regions 30 and 32. Although the gate 26 is used as a mask for both implants, region 30 extends further under the gate 26 than region 32 due to the higher diffusivity of phosphorus, as can be seen in FIG. 4.

The resultant retarded double diffused drain (DDD) structure that is shown in FIG. 4 has a reduced source/drain junction capacitance as compared to the prior art DDD device. This is more fully explained by the following. The depletion width ($W_d$) is proportional to $$\sqrt{\frac{N_1 + N_2}{N_1 \times N_2}}$$

where $N_1$ is the source/drain dopant concentration, and $N_2$ is the concentration in the p-well. Typical concentrations are $N_1 = 10^{20}$ atoms/cm.$^3$ for a heavy implant, and $N_2 = 10^{16} - 10^{17}$ atoms/cm.$^3$. The source/drain junction capacitance $C_D$ (or $C_S$) per unit area is proportional to $1/W_d$, or $$\sqrt{\frac{N_1 \times N_2}{N_1 + N_2}}.$$

Where $N_1$ is much greater than $N_2$, $C_D$ (or $C_S$) is proportional to $$\sqrt{\frac{1}{N_2}}.$$

Thus, it can be seen that $N_2$ is the major determinant of the capacitance $C_D$ (or $C_S$), and the dopant concentrations of the n+ region 30 and n++ region 32 do not have a significant effect on the source/drain junction capacitance.

$C_D$ (or $C_S$) is also proportional to ($C_{SD}$/unit area)×(area), where (area) is the three-dimensional surface area defined by the lighter doped region where it contacts the P-well region. The area of the lightly doped region of the retarded DDD structure of the invention is significantly smaller than that of the prior art DDD structure, which thus proportionately reduces the source/drain junction capacitance. This can be understood by comparing the surface area of region 16, in the prior art structure of FIG. 2, with the smaller surface area of region 30 in FIG. 4. Subsequently, with reduced capacitance, the device performance is improved.

Figure 5:
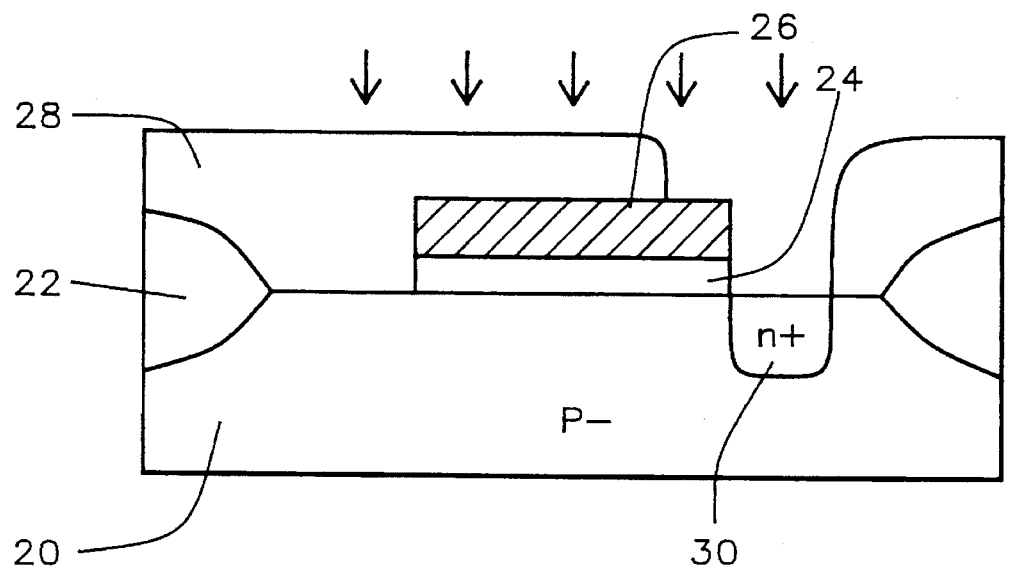

The retarded DDD structure of the invention may be used on the drain side of the device only. This is because the high electric-field problem can be on the drain side alone. In a typical application, the source side is connected to a source voltage $V_{SS}$ for the p-well, and thus has an equal potential with $V_{SS}$. Referring now to FIG. 5, a method of forming the drain-side-only retarded DDD is shown. A substrate, or alternately p-well, 20 is provided in which there are field isolation regions 22, and on which is a gate oxide 24 and gate 26, as in the method described above. A photoresist 28 is formed using conventional lithography to expose a portion of the substrate on the drain side of the device, with another portion masked to prevent implantation in the area adjacent to the field isolation region.

Figure 6:
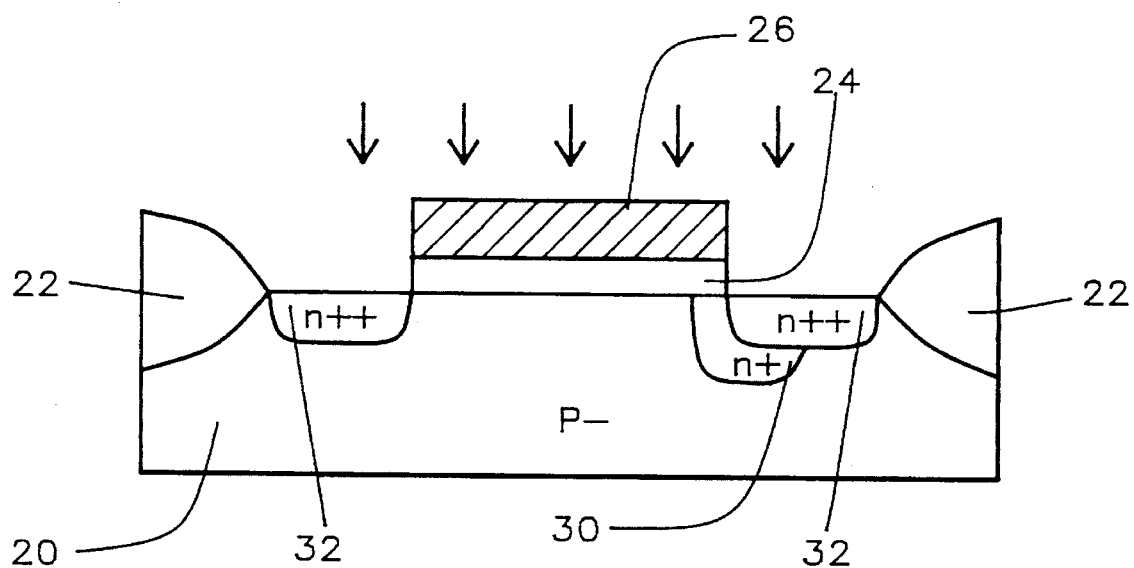

The critical ion implantation steps of this method of the invention are now performed. There is a first ion implant of phosphorus P31, to inject conductivity-imparting dopant into region 30 of the drain structure. The phosphorus is implanted at a dosage of between about 1 E 14 and 1 E 15 atoms/cm.$^2$ and at an energy of between about 50 and 180 KeV. Referring now to FIG. 6, the photoresist is removed, and a second ion implant is performed. The entire source/drain region is implanted, which results in heavily implanted regions 32. The implant is at a higher dosage than the first implant, and is accomplished with arsenic As75 at a dosage of between about 1 E 15 and 5 E 15 atoms/cm.$^2$, and at an energy of between about 50 and 150 KeV. A drive-in step is performed to drive in both regions 30 and 32. This results in a conventional active region for the source, and the retarded DDD region of the invention for the drain.

Figure 7:
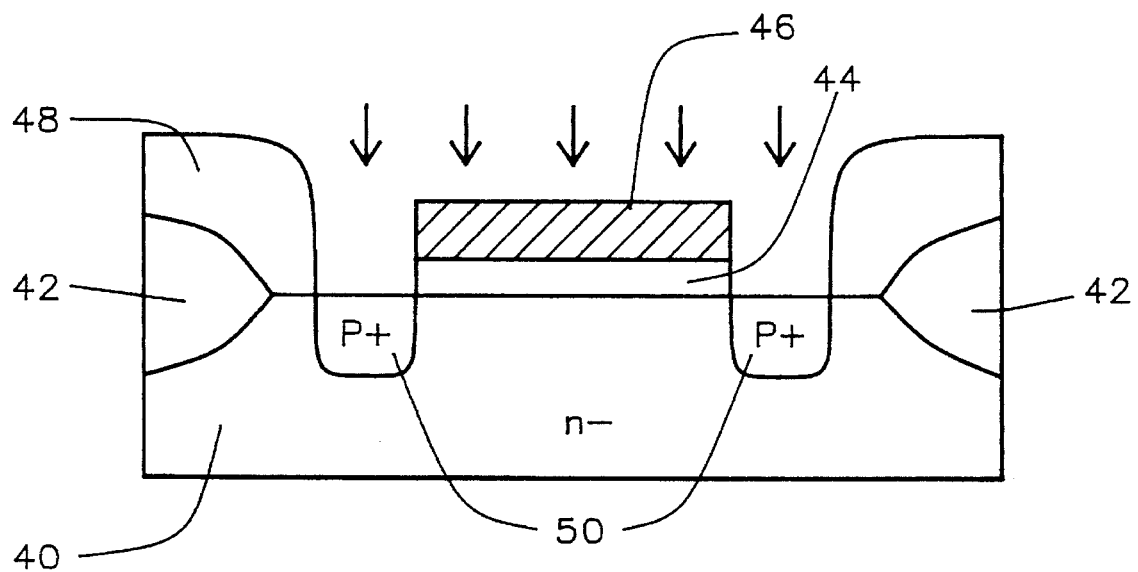
FIGS. 7 through 10 are cross-sectional representations of the improved method and resultant structure for forming a retarded double-diffused drain for a p-type device.

While the invention has been described using n-type conductivity-imparting dopants, it is well-understood by those skilled in the art that p-type dopants could be used in an n-doped substrate (or n-well) to form a p-channel device using the retarded double-diffused drain structure of the invention. There are two different methods by which this may be accomplished. FIG. 7 depicts a silicon substrate 40, field isolation regions 42, gate oxide 44 and gate electrode 46 as in the n-channel device described above. The substrate has been doped n-, and may be an n-well as used in CMOS devices for the p-channel structure.

A photoresist layer 48 is deposited and patterned by conventional lithography. It is patterned to expose only a part of the source/drain regions, with a portion of such regions adjacent to field isolation regions 42 masked off to prevent implantation. There is a first ion implant of boron B11 to inject p+ conductivity-imparting dopant into regions 50 of the source/drain structures. The boron is implanted at a dosage of between about 1 E 14 and 1 E 15 atoms/cm.$^2$ and at an energy of between about 30 and 70 KeV. The photoresist is removed, and a drive-in is performed to extend p+ regions 50 under the gate.

Figure 8:
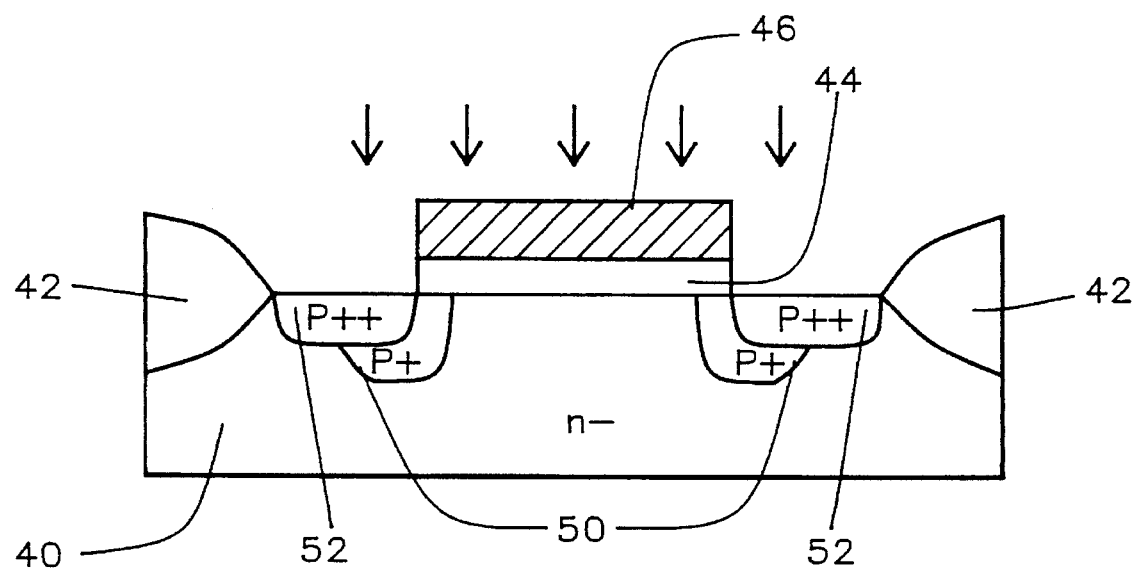

Referring now to FIG. 8, a second, heavier ion implant is performed. The entire source/drain region is implanted, which results in heavily implanted p++ regions 52. The implant is with Boron BF$_2^+$ at a dosage of between about 1 E 15 and 5 E 15 atoms/cm.$^2$, and at an energy of between about 50 and 120 KeV. The resultant retarded DDD structure for a p-channel device is shown.

Figure 9:
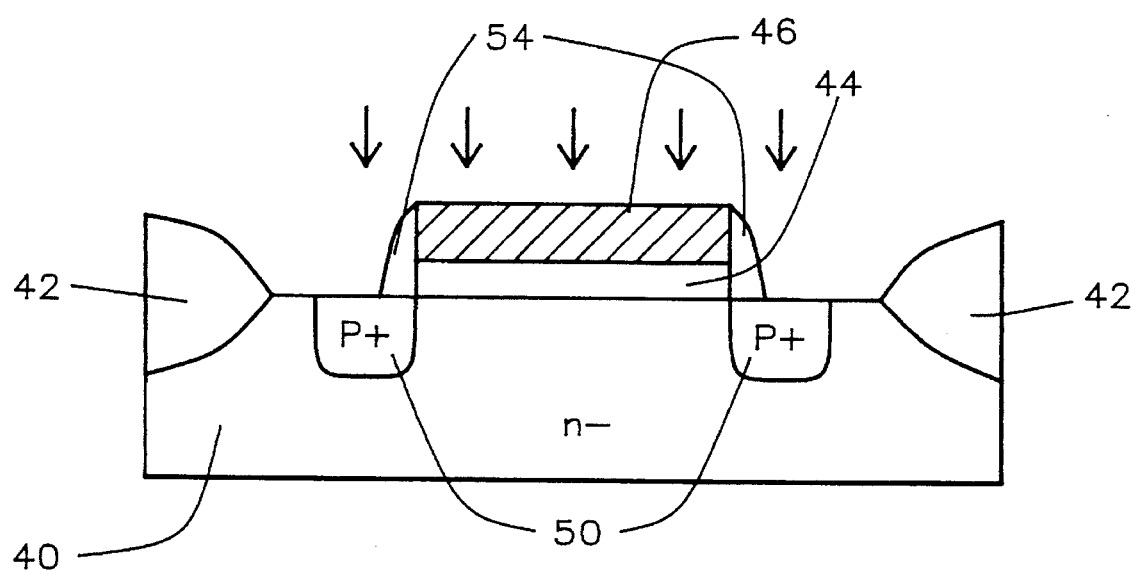

A second method for forming a p-channel device is described. Starting from the FIG. 7 structure, after B11 implant and drive-in, the photoresist is stripped. A conformal layer of an oxide, for instance, silicon oxide deposited by low-pressure chemical vapor deposition (LPCVD), as is well-known in the art, is formed. This layer is then etched by, for instance, an anisotropic reactive ion etch to form spacers 54, as shown in FIG. 9.

Figure 10:
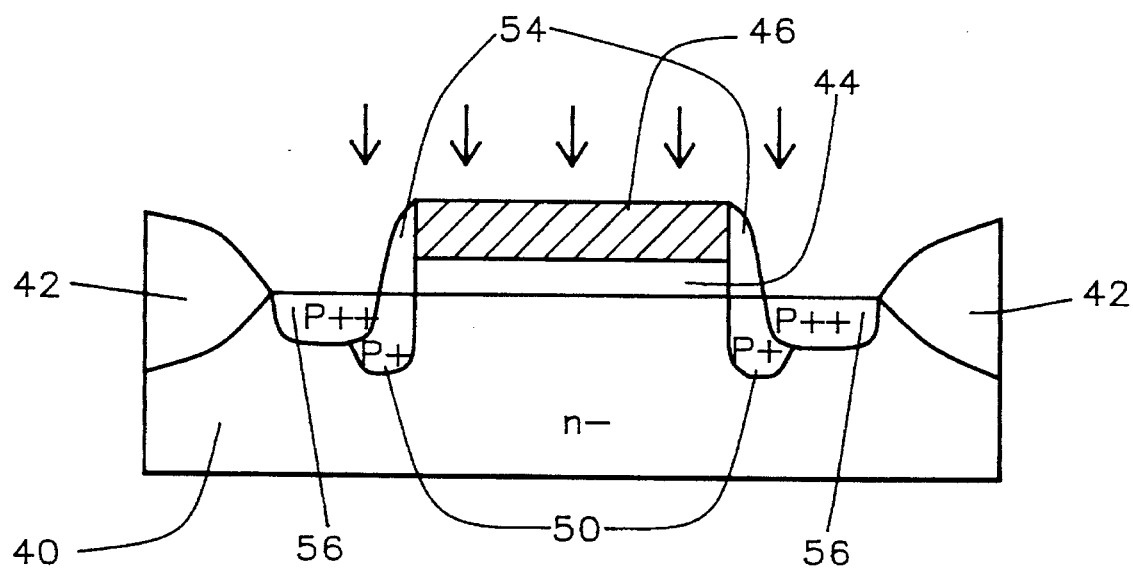

Referring now to FIG. 10, the spacers 54 and field isolation regions 42 act as a mask to allow implantation of the p++ regions 56 by an ion implant of Boron BF$_2^+$ at a dosage of between about 1 E 15 and 5 E 15 atoms/cm.$^2$, and at an energy of between about 50 and 120 KeV. Either of these two methods could be used as described above for the p-channel device, to create a retarded DDD structure in the source region only.

Also, n-channel and p-channel devices using the retarded DDD structure could be combined in the same substrate to form a CMOS device, as is well understood in the art.

While the invention has been particularly shown and described with reference to the preferred embodiments thereof, it will be understood by those skilled in the art that various changes in form and details may be made without departing from the spirit and scope of the invention.

What is claimed is:

1. A method of forming a retarded double diffused drain structure, in a silicon substrate with field isolation regions and a gate structure, comprising the steps of:

first forming a layer of photoresist on the field isolation regions, the silicon substrate, and the gate structure;

then patterning said photoresist to expose the silicon substrate and the gate structure, but covering an area of the silicon substrate that is offset from the field isolation regions;

then performing a first ion implant of a conductivity-modifying dopant in a vertical direction in exposed regions of the silicon substrate;

then removing said photoresist;

then performing a second ion implant of a conductivity-modifying dopant having the same conductivity type as in said first ion implant, in a vertical direction in the silicon substrate, wherein said second ion implant is at a higher Implantation dose than said first ion implant, in regions, between the field isolation regions and the gate structure; and heating the substrate to drive in dopants, whereby the outer edge, with respect to said gate structure, of a doped region formed by said first ion implant is offset from the outer edge of a more heavily doped region formed by said second ion implant.

2. The method of claim 1 wherein said first ion implant is with phosphorus, P, at a dose of between about 1 E 14 and 1 E 15 atoms/cm$^2$ and an energy of between about 50 and 180 KeV.

3. The method of claim 1 wherein said second ion implant is with arsenic, As, at a dose of between about 1 E 15 and 5 E 15 atoms/cm$^2$ and an energy of between about 50 and 150 KeV.

4. The method of claim 1 wherein said first ion implant is with boron, B, said second ion implant is with $BF_2^+$ and further comprising heating said substrate after said first ion implant, to drive in said boron B11.

5. The method of claim 4 wherein said boron, B, is implanted with a dosage of between about 1 E 14 and 1 E 15 atoms/cm.$^2$ and at an energy of between about 30 and 70 KeV.

6. The method of claim 4 wherein said $BF_2^+$ is implanted with a dosage of between about 1 E 15 and 5 E 15 atoms/cm.$^2$ and at an energy of between about 50 and 120 KeV.

7. A method of forming a retarded double diffused drain structure in the drain region of a field effect transistor, in a silicon substrate with field isolation regions, a gate structure and a source region, comprising the steps of:

first forming a layer of photoresist on the field isolation regions, the silicon substrate, and the gate structure;

then patterning said photoresist to expose a part of the drain region, offset from the field isolation region;

then performing a first ion implant of a conductivity-modifying dopant in said exposed part of the drain region, in a vertical direction;

then removing said photoresist;

then performing a second ion implant of a conductivity-modifying dopant having the same conductivity type as in said first ion implant, in a vertical direction wherein said second ion implant is at a higher implantation dose than said first ion implant, to form a source in the source region and the retarded double diffused drain structure in the drain region; and heating the substrate to drive in dopants, whereby the outer edge, with respect to said gate structure, of a doped region formed by said first ion implant is offset from the outer edge of a more heavily doped region formed by said second ion implant.

8. The method of claim 7 wherein said first ion implant is with phosphorus, P, at a dose of between about 1 E 14 and 1 E 15 atoms/cm$^2$.

9. The method of claim 7 wherein said second ion implant is with arsenic, As, at a dose of between about 1 E 15 and 5 E 15 atoms/cm$^2$.

10. The method of claim 7 wherein said first ion implant is with boron, B, said second ion implant is with $BF_2$, and further comprising heating said substrate after said first ion implant, to drive in said boron, B.

11. The method of claim 7 wherein said boron, B, is implanted with a dosage of between about 1 E 14 and 1 E 15 atoms/cm.2 and at an energy of between about 30 and 70 KeV.

12. The method of claim 10 wherein said boron BF2+ is implanted with a dosage of between about 1 E 15 and 5 E 15 atoms/cm.$^2$, and at an energy of between about 50 and 120 KeV.

13. A method of forming a retarded double diffused drain structure, in a silicon substrate with field isolation regions and a gate structure, comprising the steps of:

first forming a layer of photoresist on the field isolation regions, the silicon substrate, and the gate structure;

then, patterning said photoresist to expose the silicon substrate and the gate structure, but covering an area of the silicon substrate that is offset from the field isolation regions;

then performing a first ion implant of a conductivity-modifying dopant in a vertical direction in exposed regions of the silicon substrate;

then removing said photoresist;

then forming an insulating layer on the field isolation region, the silicon substrate and the gate structure;

then patterning said insulating layer to form spacers adjacent to said gate structure;

then performing a second ion implant of a conductivity-modifying dopant having the same conductivity type as in said first ion implant, in a vertical direction in the silicon substrate wherein said second ion implant is at a higher implantation dose than said first ion implant, in regions between the field isolation regions and said spacers; and heating the substrate to drive in dopants, whereby the outer edge, with respect to said gate structure, of a doped region formed by said first ion implant is offset from the outer edge of a more heavily doped region formed by said second ion implant.

14. The method of claim 13 wherein said first ion implant is with boron, B, and said second ion implant is with boron $BF_2^+$.

15. The method of claim 13 wherein said boron, B, is implanted with a dosage of between about 1 E 14 and 1 E 15 atoms/cm.$^2$ and at an energy of between about 30 and 70 KeV.

16. The method of claim 14 wherein said $BF_2^+$ is implanted with a dosage of between about 1 E 15 and 5 E 15 atoms/cm.$^2$, and at an energy of between about 50 and 120 KeV.

17. The method of claim 13 wherein said first ion implant and said second ion implant are with $BF_2^+$.

18. The method of claim 17 wherein said first ion implant has a dosage of between about 1 E 14 and 1 E 15 atoms/cm.$^2$ and is performed at an energy of between about 30 and 70 KeV.

19. The method of claim 17 wherein said second ion implant has a dosage of between about 1 E 15 and 5 E 15 atoms/cm.$^2$, and is performed at an energy of between about 50 and 120 KeV.

* * * * *